United States Patent
Yoo

(10) Patent No.: US 6,462,592 B1
(45) Date of Patent: Oct. 8, 2002

(54) CLOCK SIGNAL CONVERTING APPARATUS OF A TRANSMISSION SYSTEM

(75) Inventor: Sang Jin Yoo, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/656,212

(22) Filed: Sep. 6, 2000

(30) Foreign Application Priority Data

Sep. 7, 1999 (KR) .............................................. 99/37860

(51) Int. Cl.[7] ................................................ H03L 7/06
(52) U.S. Cl. ........................ 327/147; 327/156; 327/294
(58) Field of Search ........................ 327/141, 144–147, 327/150, 151, 154–156, 159, 160, 162, 163, 165, 166, 291, 293, 294, 407

(56) References Cited

U.S. PATENT DOCUMENTS

| | | | | |
|---|---|---|---|---|
| 5,355,090 A | * | 10/1994 | Pajowski et al. ............ | 327/292 |
| 5,422,915 A | * | 6/1995 | Byers et al. ................ | 375/357 |
| 5,530,726 A | * | 6/1996 | Ohno .......................... | 375/357 |
| 5,596,294 A | * | 1/1997 | Kadomaru et al. .......... | 327/145 |
| 5,742,208 A | * | 4/1998 | Blazo .......................... | 331/23 |
| 6,104,222 A | * | 8/2000 | Embree ....................... | 327/156 |
| 6,118,316 A | * | 9/2000 | Tamamura et al. ......... | 327/156 |
| 6,188,258 B1 | * | 2/2001 | Nakatani ..................... | 327/157 |
| 6,204,732 B1 | * | 3/2001 | Rapoport et al. ............ | 331/2 |
| 6,275,553 B1 | * | 8/2001 | Esaki .......................... | 375/371 |

* cited by examiner

Primary Examiner—Timothy P. Callahan
Assistant Examiner—Hai L. Nguyen
(74) Attorney, Agent, or Firm—Fleshner & Kim, LLP

(57) ABSTRACT

The present invention relates to a clock signal converting apparatus of a transmission system which is capable of coinciding synchronization of clock signals of a system by sharing signals of a first clock signal generator as a working unit and a second clock signal generator as a protection unit in common. In addition, the second clock signal generator can output system signals having same phase with the first clock signal generator by using output of the first clock signal as a reset signal of the counter of the second clock signal generator.

19 Claims, 4 Drawing Sheets

CLOCK SIGNAL CONVERTING APPARATUS OF A TRANSMISSION SYSTEM

BACKGROUND OF THE INVENTION

1. Field of the Invention

The present invention relates to a transmission system, in particular to a clock signal converting apparatus of the transmission system.

2. Background of the Related Art

FIG. 1 is a block diagram of a related art clock signal converting apparatus of a transmission system. As shown therein, a first clock signal generator 10 is a working unit and a second clock signal generator 20 is a protection unit. Each of the first and second clock signal generators 10, 20 generates a system clock signal SCLK, a multi-frame pulse MFP, and a frame pulse FP containing frame information, which are provided to a system 30. The system 30 performs synchronization of other signals based on inputted signals SCLK, MFP, and FP.

FIG. 2 is a block diagram of the first and second clock signal generators 10, 20 of FIG. 1. As depicted in FIG. 2, the first clock signal generator 10 comprises a Phase Locked Loop (PLL) control unit 11 for controlling a PLL, and a Voltage Controlled Oscillator (VCO) 12 for outputting a reference clock signal in accordance with an output signal of the PLL control unit 11. The first clock signal generator 10 further includes a signal generating circuit 13 for generating the system clock signal SCLK and the system signals MFP, FP based on the reference clock signal outputted from the VCO 12, and a buffer 14 for temporarily storing the signals MFP, FP, and SCLK outputted from the signal generating circuit 13. The buffer 14 outputs the signals in accordance with a converting control signal ACT. The second clock signal generator 20 has the same construction as the first clock signal generator 10, but has different reference numerals. Additionally, the second clock signal generator 20 includes an inverter, which receives and forwards the converting control signal ACT to the buffer 24.

In operation, the first and second clock signal generators 10, 20 generate the system clock signal SCLK, the multi-frame pulse MFP, and the frame pulse FP in accordance with the reference clock signal of a whole system, and provide these signals to the system 30.

As depicted in FIG. 2, the VCO 12 generates the reference clock signal in accordance with the control of the PLL control unit 11. The signal generating circuit 13 is provided with the standard clock signal, generates the system clock signal SCLK and the system signals MFP, FP, and provides them to the buffer 14.

As depicted in FIG. 3, counter 13-1, which is included in the signal generating circuit 13, counts the reference clock signal outputted from the VCO 12, generates the system clock signal SCLK, and also generates the system signals MFP, FP by using the system clock signal SCLK. Additionally, the counter 23-1, which is included in the signal generating circuit 23, counts the reference clock signal outputted from the VCO 22, generates the system clock signal SCLK, and also generates the system signals MFP, FP by using the system clock signal SCLK. Here, the counters 13-1, 23-1 are reset by a carrier value internally generated.

The buffers 14, 24 separately and temporarily store the system clock signal SCLK and the system signals MFP, FP outputted from the signal generating circuit 13, 23. When outputs of the two buffers 14, 24 are provided to the system 30 at the same time, it causes the signals to collide. Thus, the outputs of the buffers 14, 24 are controlled by using the converting control signal ACT. That is, when the buffer 14 outputs the signals SCLK, MFP, and FP, an output of the buffer 24 is controlled so as to be tri-state. On the other hand, when the buffer 24 outputs the signals SCLK, MFP, and FP, an output of the buffer 14 is controlled so as to be tri-state. Collisions of the signals can thus be prevented.

As a result, if the first and second clock signal generators 10, 20 are converted by the converting control signal ACT, the related art system 30 can stably perform synchronization of the signals in an emergency situation.

The related art first and second clock signal generators 10, 20 perform synchronization in accordance with the reference clock signal of the whole system. However, a rate of the reference clock signal of the whole system is lower than the output signal of the VCO. Thus, when synchronization between the first and second clock signal generators 10, 20 is performed in accordance with a reference clock signal of the whole system, a phase difference between the first and second clock signal generator 10, 20 may be bigger than half a cycle of the VCO output.

In addition, the first and second clock generators 10, 20 separately generate signals required for the system by using separate VCOs. Thus, the timing synchronization of the system clock signal outputted from the first clock generator is different than that of the system clock signal outputted from the second clock generator.

Also, the related art signal generating circuit generates the system clock signal SCLK by using the output of the VCO and then generates the system signals MFP, FP by using the counter.

As depicted in FIG. 4, the phase of the system signals MFP, FP outputted from the first and second clock signal generator 10, 20 is also different than each other, because a reset timing of the counter included in the each signal generating circuit is different.

Accordingly, in the related art clock signal converting apparatus of the transmission system, when the conversion is performed from the first clock signal generator to the second clock signal generator, a system error occurs due to a synchronization discordance of the signal, i.e. the system clock signal and the system signal. Further, the error causes damage to a service provided by the system.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a clock signal converting apparatus of a transmission system that substantially obviates one or more problems caused by the disadvantages of the related art.

Another object of the present invention is to provide a stable system clock signal and system signal.

Another object of the present invention to to prevent a system error generated during conversion of a clock generator by synchronizing the two clock signal generators. It is another object of the present invention to provide a network synchronization by providing stable system clock signals and system signals.

To achieve at least these objects in whole or in parts, there is provided a clock signal converting apparatus of a transmission system having a first and a second clock signal generator, which separately generate various signals required for a system, the second clock signal generator is synchronized to the reference clock signal outputted from a VCO of the first clock signal generator in conversion of clock signal generator.

To achieve at least these objects in whole or in parts, there is further provided a clock signal converting apparatus of a transmission system that uses an output signal of the first clock signal as a reset signal of a counter included in the second clock signal generator in conversion of the clock generator.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
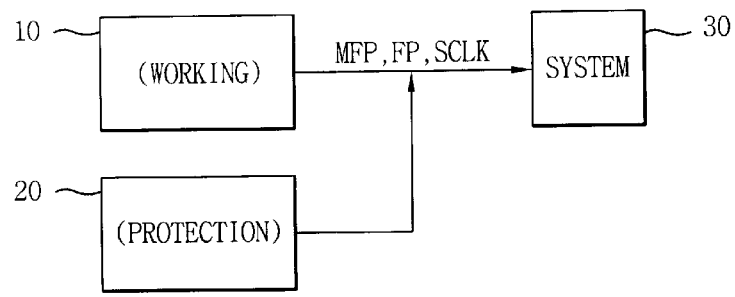
FIG. 1 is a schematic block diagram of a related art clock signal converting apparatus of a transmission system.
Figure 2:
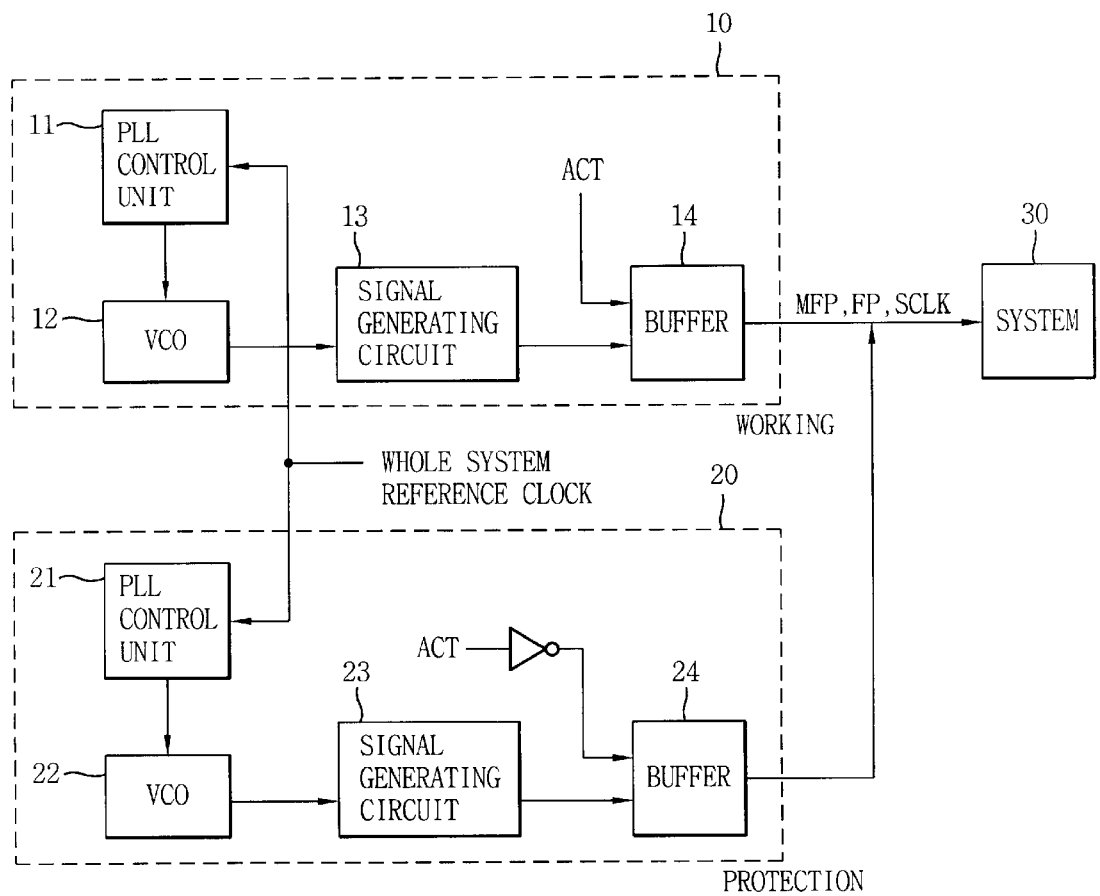
FIG. 2 is a block diagram of the related art clock signal converting apparatus of the transmission system.
Figure 3:
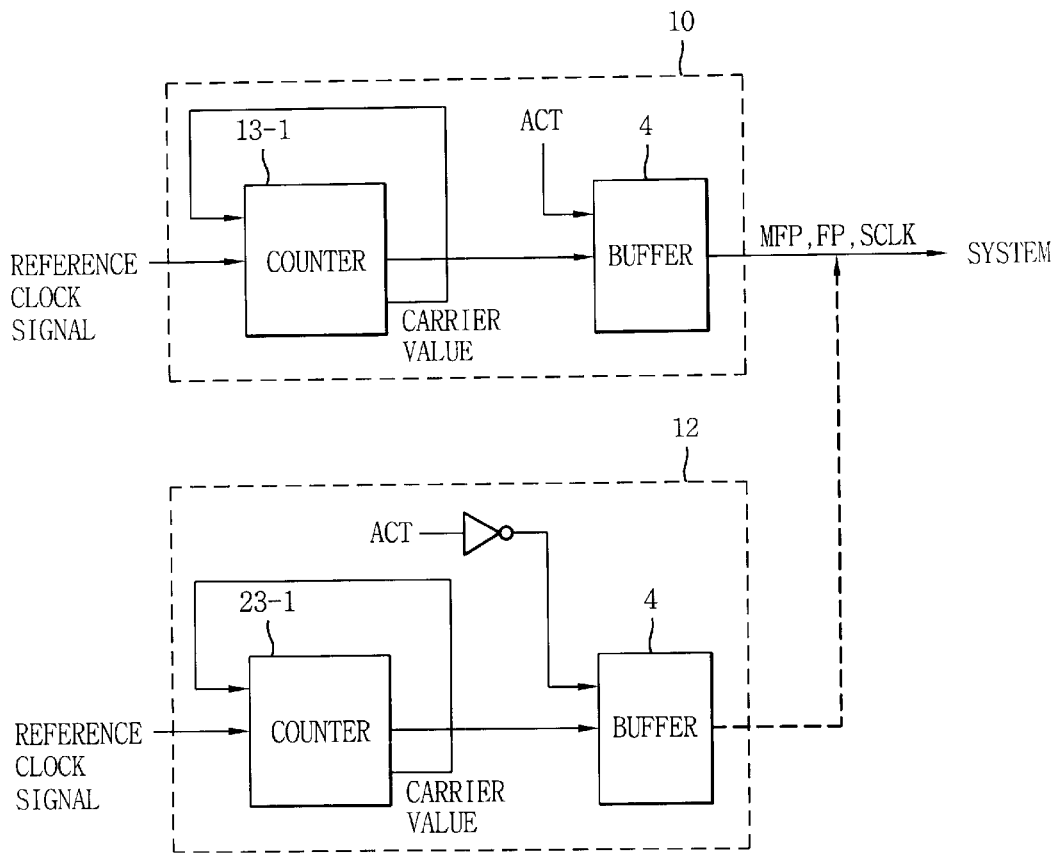
FIG. 3 is a circuit diagram of a counter included in a signal generating circuit of FIG. 2.
Figure 4:
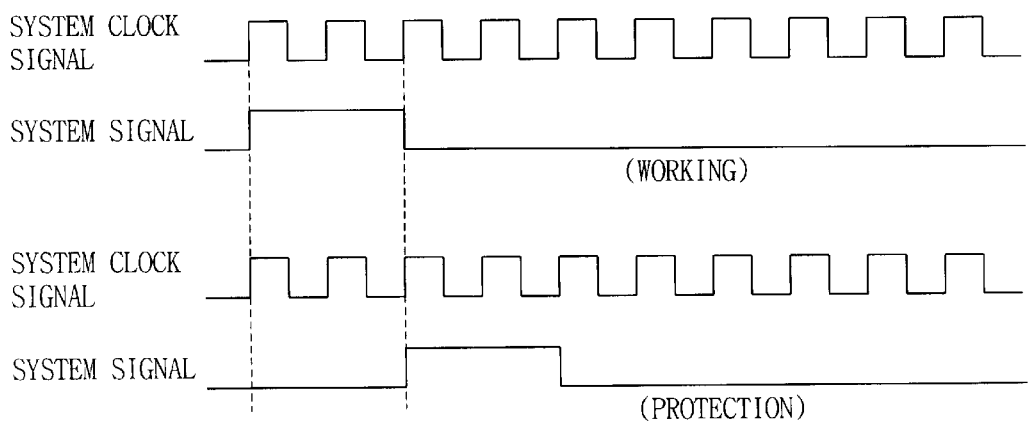
FIG. 4 is a waveform diagram illustrating a phase difference between the system signals generated by a first and a second clock signal generators in conversion of the clock generator.
Figure 5:
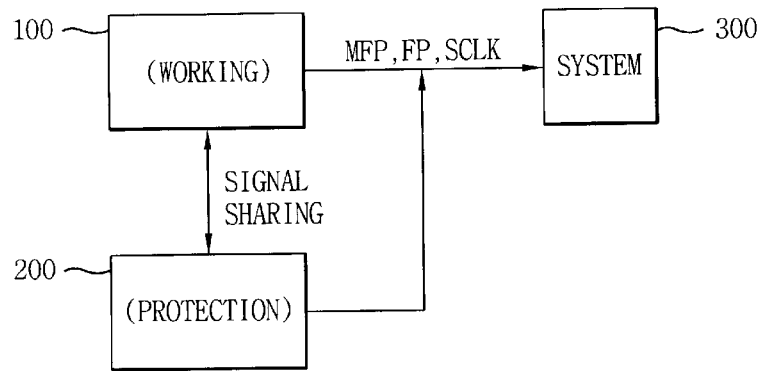
FIG. 5 is a schematic block diagram of a clock signal converting apparatus of the transmission system of a preferred embodiment of the present invention.

Referring to FIG. 5, the present invention, according to a preferred embodiment, is capable of synchronizing independently generated system signals by sharing signals of a first clock generator 100 as a working unit and a second clock signal generator 200 as a protection unit. Thus, by communicatively coupling the first an second clock signal generators 100, 200, system synchronization can be established.

Figure 6:
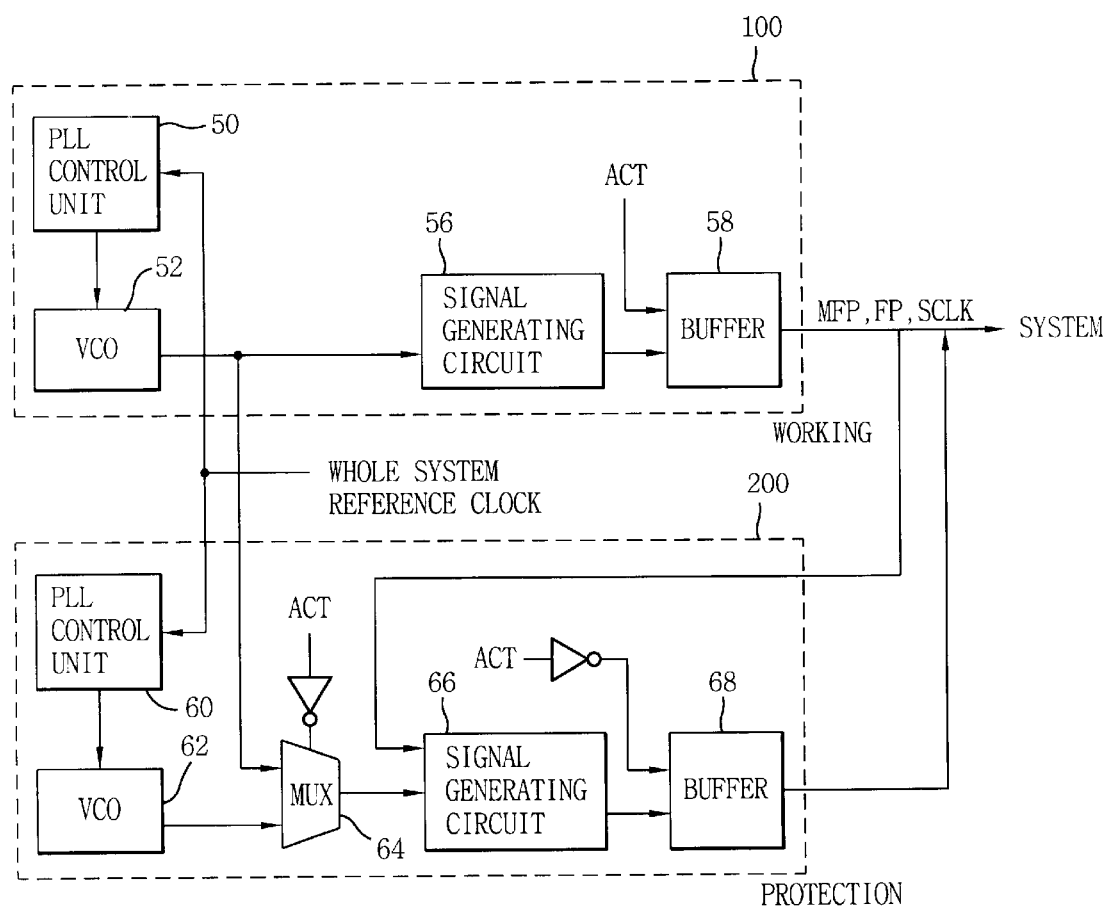
FIG. 6 is a block diagram of the clock signal converting apparatus of the transmission system of a preferred embodiment of the present invention.

FIG. 6 is a block diagram of the first and second clock signal generators 100, 200. Referring to FIG. 6, the first clock signal generator 100 includes a PLL control unit 50 and a VCO 52. It further includes signal generating circuit 56 and buffer 58. The second clock signal generator 200 includes a PLL control unit 60, a VCO 62, a signal generating unit 66, and a buffer 68. The second clock signal generator 200 additionally includes a multiplexer MUX 64. In addition, system signals MFP, FP outputted from the first clock signal generator 100 are inputted to the signal generating circuit 66 of the second clock signal generator 200 as a reset signal.

In operation, when a clock signal generator is not converted, the second clock signal generator 200 is synchronized with the output of a VCO 52 of the first clock signal generator 100. This preferably prevents a phase difference that may be generated between the first and second clock signal generators 100, 200. Thus, when a converting control signal ACT is at a low-level, the MUX 64 of the second clock signal generator 200 selectively outputs a reference clock signal outputted from the VCO 62 in accordance with the high level converting control signal ACT.

Figure 7:
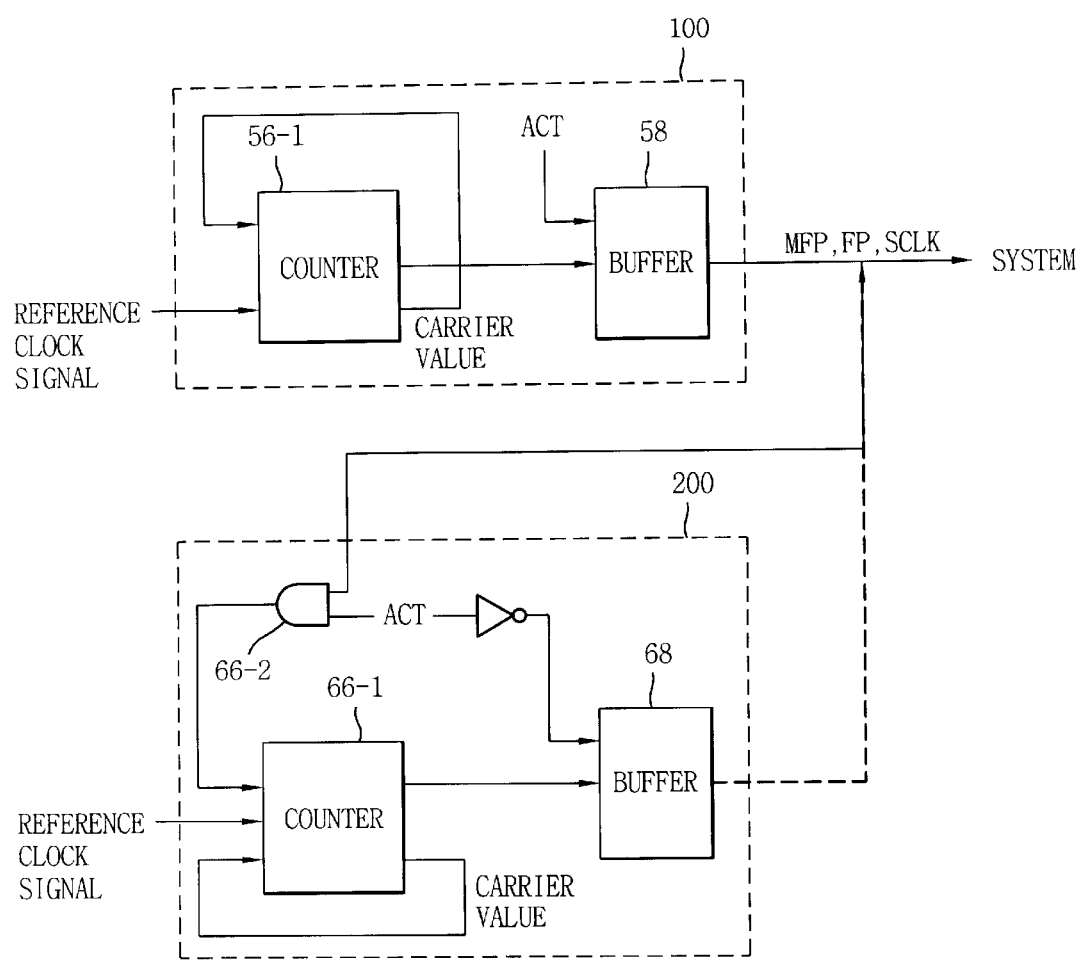
FIG. 7 is a circuit diagram of a counter inside of the signal generating circuit of FIG. 5.

The signal generating circuits 56, 66 respectively generate first and second system clock signals SCLK in accordance with the reference clock signal outputted from the corresponding VCO 52, 62. The signal generating circuits 56, 66 then generate system signals MFP, FP by using the counter (FIG. 7). However, the output of the buffer 68 is now in a tri-state condition based on the converting control signal ACT. Thus, only buffer 58 of the first clock signal generator 100 provides the generated system clock signals SCLK and the system signals MFP, FP to a system 300.

When, however, the clock signal generator is converted, the converting control signal ACT is converted into a high level. The MUX 64 accordingly outputs the reference clock signal outputted from the VCO 52 to the signal generating circuit 66 in accordance with the converting control signal ACT of the low level signal inverted through the inverter. The signal generating circuit 56, 66 thus generate the system clock signal SCLK and the system signals MFP, FP in accordance with the reference clock signal outputted from the VCO 52.

The output of the buffer 58, however, is now in a tri-state condition based on the converting control signal ACT. Therefore, only the buffer 68 provides the system clock signal SCLK and the system signal MFP, FP to the system 300. It is thus possible to prevent phase differences generated between the first and second clock signal generator 100, 200 by synchronizing the second clock signal generator 200 with the output of the VCO 52 of the first clock signal generator 100 in conversion of clock signal generator.

As depicted in FIGS. 5 and 7, in order to prevent the phase difference of the system signals MFP, FP, the output of the first clock signal generator 100 is fed back and used as a reset signal of the counter 66-1. Accordingly, when the converting control signal ACT is at a high level, the AND gate 66-2 provides the output of the first clock signal generator 100 to the counter 66-1, and the counter 66-1 outputs the system signals MFP, FP having same phase as the first clock signal generator 100.

Although in the preferred embodiment of the present invention the conversion of the first clock signal generator 100 into the second clock signal generator 200 is described, it should be understood that the second clock signal generator 200 could be the working unit and the first clock signal generator 100 could be the protection unit.

As described above, the clock signal converter, according to the preferred embodiment, has many advantages. For example, it is capable of preventing system error generated in conversion of clock generator by coinciding synchronization of two different clock signal generator, and constructing a network synchronization generally by providing more stable system clock signals and system signals.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A clock signal converting apparatus of a transmission system, comprising:

first and second clock signal generators, which each receive a system reference clock signal and separately generate a plurality of signals required for a system, wherein the second clock signal generator is synchronized to a reference clock signal outputted from a first voltage controlled oscillator (VCO) of the first clock signal generator in conversion of the clock signal generator, wherein the second clock signal generator generates a system clock signal in accordance with the reference clock signal, and comprises a signal generating circuit that generates system signals, and wherein the signal generating circuit is reset by an output signal of the first clock signal generator.

2. The apparatus of claim 1, wherein one of the first and second clock signal generators is a working unit, and the other is a protection unit.

3. The apparatus of claim 1, wherein the second clock signal generator comprises:

a Phase Locked Loop (PLL) control unit to control a PLL operation;

a second VCO to output the reference clock signal in accordance with the output signal of the PLL control unit;

a multiplexer to selectively output the output of the first and second VCOs in accordance with a converting control signal;

a signal generating circuit to receive the reference clock signal from the multiplexer and generate a system clock signal and a system signal; and a buffer to store the signals generated from the signal generating circuit and output the stored signals to the system in accordance with the converting control signal.

4. The apparatus of claim 1, wherein each of the first and second clock signal generators comprises a phase locked loop control unit coupled to receive the system clock signal and provide an output signal to first and second VCOs, respectively.

5. A clock signal converting apparatus, comprising:

a first clock signal generator, coupled to receive a standard clock signal and generate a first system clock signal, a first multi-frame pulse, and a first frame pulse; and a second clock signal generator, coupled to receive the standard clock signal and generate a second system clock signal, a second multi-frame pulse, and a second frame pulse, wherein the first clock signal generator provides the first system clock signal directly to the second clock signal generator, and wherein the first clock signal generator is synchronized with the second clock signal generator.

6. A clock signal converting apparatus of a transmission system, comprising:

first and second clock signal generators coupled to receive a system reference clock signal, which each generate a system clock signal and a system signal for a system by using a reference clock signal outputted from first and second voltage controlled oscillators (VCO); and a selector, which directly outputs an undelayed reference clock signal outputted from the first VCO to the second clock signal generator according to a converting control signal.

7. The apparatus of claim 6, wherein the second clock signal generator further includes an inverter to invert the converting control signal.

8. The apparatus of claim 6, wherein the second clock signal generator generates the system signal which is synchronized with the output of the first clock signal generator.

9. The apparatus of claim 6, wherein the first clock signal generator comprises:

a first Phase Locked Loop (PLL) control unit for controlling a PLL operation;

a first VCO for outputting the reference clock signal in accordance with the output signal of the first PLL control unit;

a first signal generating circuit to receive the reference clock signal from the first VCO and generate the system clock signal and the system signal; and a first buffer to temporarily store the signals generated from the first signal generating circuit and outputting the stored signals to the system in accordance with the converting control signal.

10. The apparatus of claim 6, wherein the second clock signal generator is synchronized with the reference clock signal outputted from the first VCO.

11. The apparatus of claim 6, wherein the second clock signal generator further directly receives at least one of the system clock signal and the system signal outputted from the first clock signal generator.

12. The apparatus of claim 6, wherein the second clock signal generator comprises:

a second Phase Locked Loop (PLL) control unit for controlling a PLL operation;

a second VCO for outputting the reference clock signal in accordance with the output signal of the second PLL control unit;

a second signal generating circuit to receive the reference clock signal from the multiplexer and generate the system clock signal and the system signal; and a second buffer to temporarily store the signals generated from the second signal generating circuit and outputting the stored signal to the system in accordance with the converting control signal.

13. A clock signal converting apparatus of an optical transmission system, comprising:

a first clock signal generator, which generates signals using a reference clock signal outputted from a first voltage controlled oscillator (VCO); and a second clock signal generator, which generates signals using the reference clock signal outputted from a second VCO, wherein the second clock signal generator includes, a Phase Locked Loop (PLL) control unit for controlling a PLL operation;

the second VCO to output the reference clock signal in accordance with the output signal of the PLL control unit;

a multiplexer to selectively output an output of one of the first and second VCOs in accordance with a converting control signal;

a signal generating circuit to receive the reference clock signal from the multiplexer and generate the system clock signal and the system signal; and a buffer to temporarily store the signals generated by the signal generating circuit and output the stored signals to the system in accordance with the converting control signal.

14. The apparatus of claim 13, wherein the first clock signal generator is a working unit and the second clock signal generator is a protection unit.

15. The apparatus of claim 13, wherein an output of the first clock signal generator is synchronized with an output of the second clock signal generator.

16. The apparatus of claim 13, wherein the signal generating circuit comprises a counter to generate the system clock signal and the system signal, and wherein the counter is reset by the output signal of the first clock signal generator in accordance with a conversion control signal.

17. The apparatus of claim 16, wherein the counter is coupled to receive a clock signal, an output of the first clock signal generator, and a counter feedback signal as input signals.

18. A method of synchronizing a clock signal converting apparatus of a transmission system, comprising:

providing a reference signal to first and second clock signal generators to generate first and second output signals;

providing the first output signal directly to the second clock signal generator to control the second clock signal generator; and generating first and second system signals and first and second system clock signals based on the reference clock signal, wherein the first and second system signals and first and second system clock signals are synchronized in phase, and wherein at least one of the first system signal and first system clock signal is provided to the second clock signal generator.

19. A clock signal converting apparatus of a transmission system, comprising:

first and second transitioning signal generators, which generate a plurality of signals, wherein the second transitioning signal generator receives an undelayed reference signal outputted from a first oscillator of the first transitioning signal generator, and at least one of the plurality of signals generated by the first transitioning signal generator.

* * * * *